(12) United States Patent
Kaneko et al.

(10) Patent No.: US 6,477,079 B2
(45) Date of Patent: *Nov. 5, 2002

(54) VOLTAGE GENERATOR FOR SEMICONDUCTOR DEVICE

(75) Inventors: Tetsuya Kaneko; Junichi Okamura, both of Yokohama (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/313,282

(22) Filed: May 18, 1999

(65) Prior Publication Data

US 2001/0021138 A1 Sep. 13, 2001

(51) Int. Cl.[7] .............................. G11C 11/24; G11C 7/00
(52) U.S. Cl. ........................................ 365/149; 365/226
(58) Field of Search ................................ 365/149, 226, 365/51

(56) References Cited

U.S. PATENT DOCUMENTS

| | | | |
|---|---|---|---|
| 4,964,084 A | 10/1990 | Jung et al. ................ 365/226 |
| 5,249,155 A | 9/1993 | Arimoto et al. ............ 365/226 |
| 5,253,202 A | * 10/1993 | Bronner et al. ............ 365/149 |
| 5,309,399 A | 5/1994 | Murotani ................... 365/226 |
| 5,369,317 A | 11/1994 | Casper et al. .................. 326/87 |
| 5,376,832 A | 12/1994 | Gariboldi et al. .......... 365/226 |
| 5,398,207 A | 3/1995 | Tsuchida et al. ........... 365/226 |
| 5,402,375 A | 3/1995 | Horiguchi et al. ..... 365/189.09 |
| 5,489,544 A | * 2/1996 | Rajeevakumar ............ 365/149 |
| 5,490,116 A | * 2/1996 | Tobita et al. ............... 365/149 |
| 5,508,971 A | 4/1996 | Cernea et al. .............. 365/226 |
| 5,546,349 A | * 8/1996 | Watanabe et al. ............. 365/63 |
| 5,563,825 A | 10/1996 | Cernea et al. .............. 365/226 |
| 5,592,420 A | 1/1997 | Cernea et al. .............. 365/226 |
| 5,612,920 A | 3/1997 | Tomishima .................. 365/226 |
| 5,636,158 A | * 6/1997 | Kato et al. ..................... 365/63 |
| 5,640,350 A | * 6/1997 | Iga ............................... 365/51 |
| 5,646,516 A | 7/1997 | Tobita ........................... 323/313 |
| 5,805,494 A | * 9/1998 | El-Kareh et al. ........... 365/149 |
| 5,805,509 A | * 9/1998 | Leung et al. ............... 365/149 |
| 5,923,593 A | * 7/1999 | Hsu et al. ................... 365/149 |
| 6,140,805 A | * 10/2000 | Kaneko et al. ............. 365/226 |

* cited by examiner

Primary Examiner—Trong Phan
(74) Attorney, Agent, or Firm—Banner & Witcoff, Ltd.

(57) ABSTRACT

A voltage generator for outputting an output voltage at an output terminal thereof includes a driver MOS transistor of a first conductivity type having a first end connected to said output terminal and a capacitor connected between the output terminal and a second voltage node. The capacitor comprises a plurality of trench capacitors formed in a semiconductor substrate.

13 Claims, 17 Drawing Sheets

WITHOUT PMOS SW

WITH PMOS SW

CONTROL SIGNAL OF PMOS SW

500ns/div

WITH 100pF CAPACITOR
/16MBITS ARRAY

WITH 500pF CAPACITOR
/16MBITS ARRAY

WITH 2nF CAPACITOR
/16MBITS ARRAY

VOLTAGE GENERATOR FOR SEMICONDUCTOR DEVICE

TECHNICAL FIELD

The present invention generally relates to a voltage generator and, more particularly, to a voltage generator for a semiconductor device such as a semiconductor memory device.

BACKGROUND OF THE INVENTION

FIG. 1 shows an arrangement of a sense amplifier circuit 1 for amplifying a potential difference on bit lines BL and /BL. Memory cells (not shown) such as dynamic random access memory (DRAM) cells are connected to the bit lines. Sense amplifier circuit 1 includes P-channel MOS transistors 2 and 3 and N-channel MOS transistors 4 and 5. P-channel MOS transistor 2 has a gate connected to bit line /BL and a first end connected to bit line BL. P-channel MOS transistor 3 has a gate connected to bit line BL and a first end connected to bit line /BL. The second ends of P-channel MOS transistors 2 and 3 are connected together to a drive signal line 7 which is selectively supplied with a sense amplifier drive signal SAP. N-channel MOS transistor 4 has a gate connected to bit line /BL and a first end connected to bit line BL. N-channel MOS transistor 5 has a gate connected to bit line BL and a first end connected to bit line /BL. The second ends of N-channel MOS transistors 4 and 5 are connected to a drive signal line 8 which is selectively supplied with a sense amplifier drive signal /SAN. FIG. 1 further shows a PMOS driver transistor 6 having a first end connected to drive signal line 7 and a second end connected to a VBLH generator. The gate of PMOS driver transistor 6 is supplied with a switching signal for turning ON PMOS driver transistor 6 to supply the sense amplifier drive signal SAP to the second ends of P-channel MOS transistors 2 and 3.

FIG. 2 shows a conventional PMOS voltage generator 10, which may be used as the VBLH generator of FIG. 1. PMOS voltage generator 10 includes a comparator 12, a P-channel MOS transistor 14, a first resistive element 16, and a second resistive element 18. P-channel MOS transistor 14, resistive element 16, and resistive element 18 are connected in series between a first voltage VCC (e.g., 3.3 volts) and a second voltage VSS (e.g., ground). The output terminal of PMOS voltage generator 10 is a node between P-channel MOS transistor 14 and resistive element 16. The output voltage VBLH may be, for example, 1.8 volts. One input terminal of comparator 12 is connected to a reference voltage and the other input terminal of comparator 12 is connected to a feedback voltage derived from a node between first and second resistive elements 16 and 18.

However, the feedback operation of PMOS voltage generator 10 of FIG. 2 is relatively slow and it is difficult for PMOS voltage generator 10 to satisfy peak current demands. In order to overcome this problem, a so-called "active-kicker" may be provided as shown in FIG. 3. Specifically, the active kicker is a P-channel MOS transistor 20 connected between the voltage VCC and the output terminal of the PMOS voltage generator 10. This active kicker is switched ON to provide a larger current IBLH and thereby enhance the response of the voltage generator. However, the active kicker causes noise problems. In addition, since the current IBLH depends on various factors such as the data pattern of the data stored in the memory cells to which the bit lines are connected, the memory cell capacitance, and the bit line capacitance, it is difficult to provide the appropriate current IBLH (current bit line high).

FIG. 4 shows a conventional NMOS source follower type voltage generator 40. Voltage generator 40 includes a VppA generator 32 and an N-channel MOS driver transistor 34. Examples of circuits which may be utilized as VppA generator 32 are shown in FIGS. 5(a) and 5(b). N-channel MOS driver transistor 34 has a first end connected to a voltage VCC (e.g., 3.3 volts) and a gate supplied with the output voltage of VppA generator 32 (e.g., about 2.3 volts). N-channel MOS driver transistor 34 is a relatively large transistor having, for example, a total channel width of about 74 millimeters and a channel length of about 0.36 micrometers. A VBLH voltage of 1.8 volts is output from voltage generator 40. Voltage generator 40 of FIG. 4 is advantageous in that it is responsive to rapid variations of load current. However, as can be seen with reference to FIG. 7(a), the sub-threshold current of the N-channel MOS driver transistor 34 gradually raises the output voltage VBLH during a pre-charge cycle (including a stand-by condition) and a low-frequency operation condition. VppA may be a constant voltage (for example, 2.3 V). Accordingly, the gate voltage of the N-MOS driver 34 is also kept constant. When the voltage difference between the gate node of the NMOS driver and the source node of the NMOS driver becomes larger than the threshold voltage of the NMOS driver, large current is supplied to the VBLH node. When the load current becomes, zero, the sub-threshold leakage of the NMOS driver causes "voltage creep." The degree of voltage creep depends on the characteristics of the N-channel MOS driver transistor, but such creep could adversely affect restore levels or sensing margin.

One solution to this voltage creep is to utilize a current bleeder circuit 36 as shown in FIG. 6. Bleeder circuit 36 bleeds the sub-threshold current of the N-channel MOS driver transistor 34 so that voltage creep may be eliminated as can be seen with reference to FIG. 7(b). In general, subthreshold leakage does not depend on the active/stand-by state of the device. To suppress the voltage creep completely, a large bleeder current is needed even when the device is in a stand-by state. However, a bleeder circuit wastes current. For example, the bleeder currents in the active and stand-by states are 2 milliamps and 1 microamp, respectively, in for example a 64 Mbit DRAM. If the size of the NMOS driver transistor is increased to provide for a larger current IBLH and to thereby improve response, the bleeder current becomes even larger. In the case of a 256 Mbit DRAM, the size of the NMOS driver transistor becomes four times larger than that of the 64 Mbit DRAM. So the resulting bleeder current becomes four times larger than that found in the 64 Mbit DRAM. In addition, if the actual sub-threshold leakage current is different from the design value (due to, for example, process variations), current compensation can become difficult and the characteristics of VBLH may be adversely affected.

Because of the connection to the bit lines, the IBLH can be a very large and spiky current, particularly in the case of highly integrated semiconductor memory devices such as 256 Mbit DRAM devices. Accordingly, the construction and operation of the VBLH generator is a very important design consideration for highly integrated semiconductor memory devices. While the above-described arrangements might be effectively adapted for use in semiconductor memory devices such as 16 Mbit DRAMs, the current requirements for highly integrated semiconductor memory devices such as 256 Mbit DRAMs make use of VBLH generators such as those described above problematic.

In addition, the type and layout of the components of the VBLH generator can adversely impact on the goal of achieving a highly integrated memory device. For example, the N-channel MOS driver transistors of the VBLH generators have been arranged adjacent to a memory cell array as shown in FIG. 8.. FIG. 8 shows a memory cell array 90. Although not shown in FIG. 8 for purposes of clarity, memory cell array 90 includes DRAM cells arranged in rows and columns and connected to word lines and bit lines. VBLH driver component sections 92a and 92b are arranged on two opposite sited of memory cell array 90. Each of these sections 92a and 92b is connected to VBLH wire 94 which extends above the memory cell array 90. In the arrangement of FIG. 8, separate relatively wide power lines are required for supplying power to each of the sections 92a and 92b. This can complicate the arrangement of wiring connections between the memory cell array 90 and the column decoder and DQ buffer section 94.

SUMMARY OF THE INVENTION

In accordance with one aspect of the present invention, a voltage generator for outputting an output voltage at an output terminal thereof includes a driver MOS transistor of a first conductivity type having a first end connected to said output terminal and a capacitor connected between the output terminal and a second voltage node. The capacitor comprises a plurality of trench capacitors formed in a semiconductor substrate.

The use of trench capacitors for the capacitor is advantageous as compared, for example, with the use of planar capacitors because trench capacitors can provide a high capacitance while using a relatively small amount of area. Thus, the use of trench capacitors is consistent with the goal of providing highly integrated semiconductor memory devices. In addition, the structure of trench capacitors used for the capacitor is preferably almost the same as the capacitor of a memory cell. Thus, the trench capacitors for the capacitor can be formed without significant impacting the semiconductor memory device manufacturing process.

In accordance with another aspect of the present invention, a semiconductor memory device includes a plurality of memory cell arrays, each memory cell array comprising memory cells connected to bit lines and sense amplifiers for sensing potential differences on the bit lines. Voltage generators generate voltages supplied to the sense amplifiers, wherein each voltage generator includes driving circuitry arranged on one side of a corresponding one of the memory cell arrays and capacitors arranged on a side of the corresponding one of the arrays opposite to the one side.

By forming the capacitors on a side of the memory cell array opposite to the driving circuitry, the capacitors can thereby function as a passive current supply. In addition, since the driver circuitry is located on only one side of the array, a power line for the voltage generator need only be provided on one side of the array, thereby simplifying wiring.

BRIEF DESCRIPTION OF THE DRAWINGS

The accompanying drawings, which are incorporated in and constitute a part of the specification, illustrate various embodiments of the present invention and, together with the general description given above and the detailed description provided below, serve to explain the principles of the invention.

DETAILED DESCRIPTION

Figure 1:
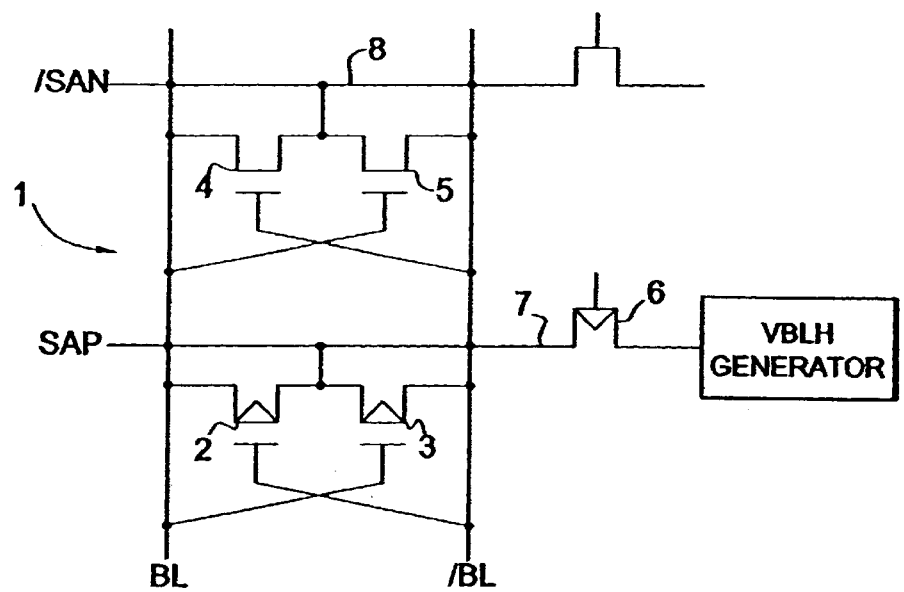
FIG. 1 shows a sense amplifier circuit.
Figure 2:
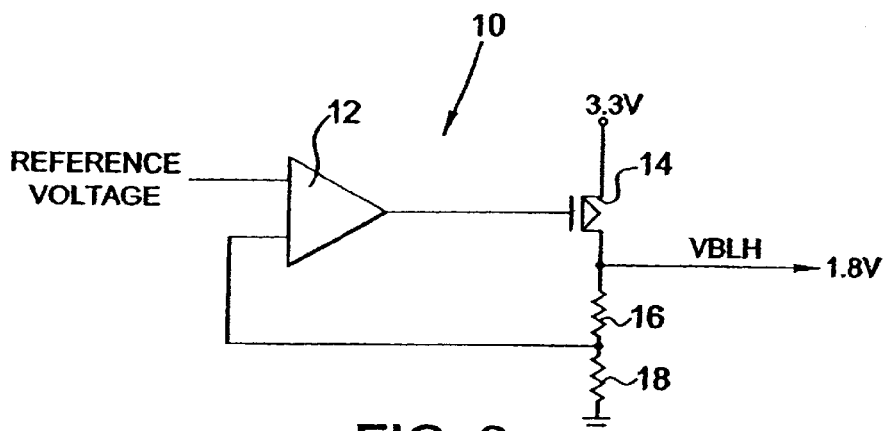
FIG. 2 shows a first type of voltage generator.
Figure 3:
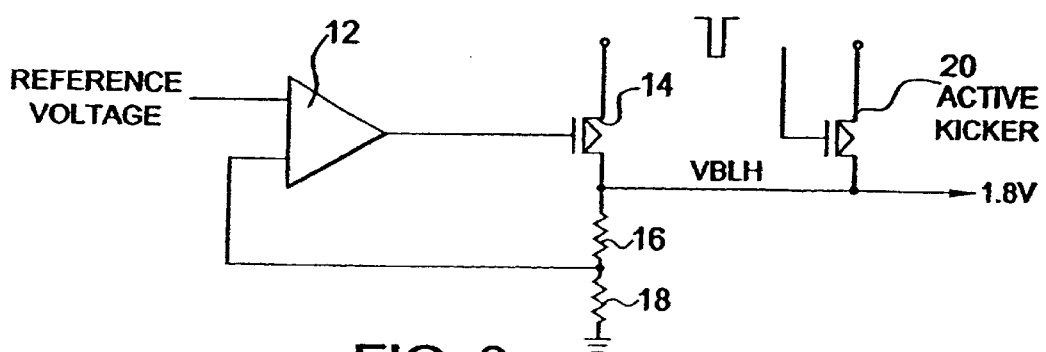
FIG. 3 shows the voltage generator of FIG. 2 modified to include an active kicker.
Figure 4:
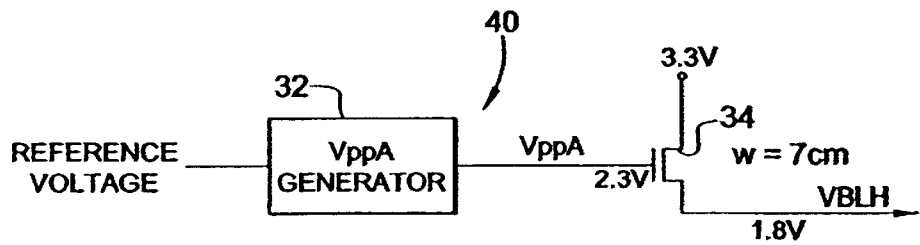
FIG. 4 shows a second type of voltage generator.
Figure 5A:
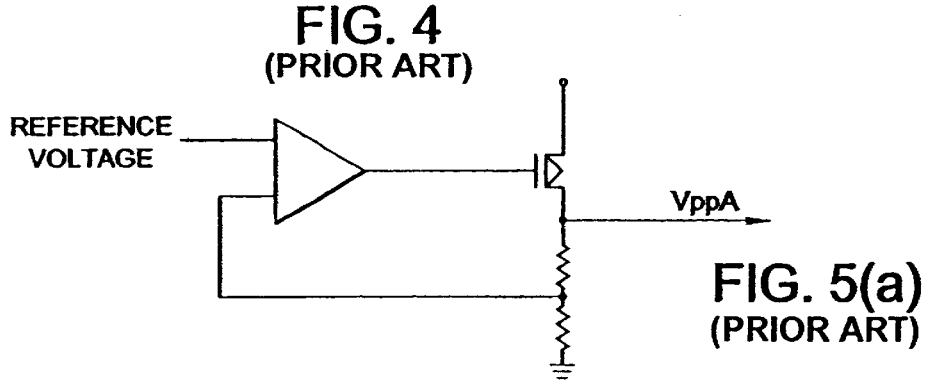
FIGS. 5(a) and 5(b) show VppA voltage generating circuits usable in the type of voltage generator shown in FIG. 4.
Figure 5B:
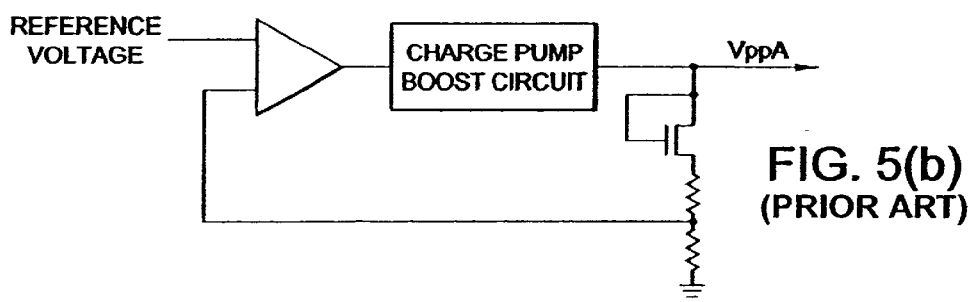
Figure 6:
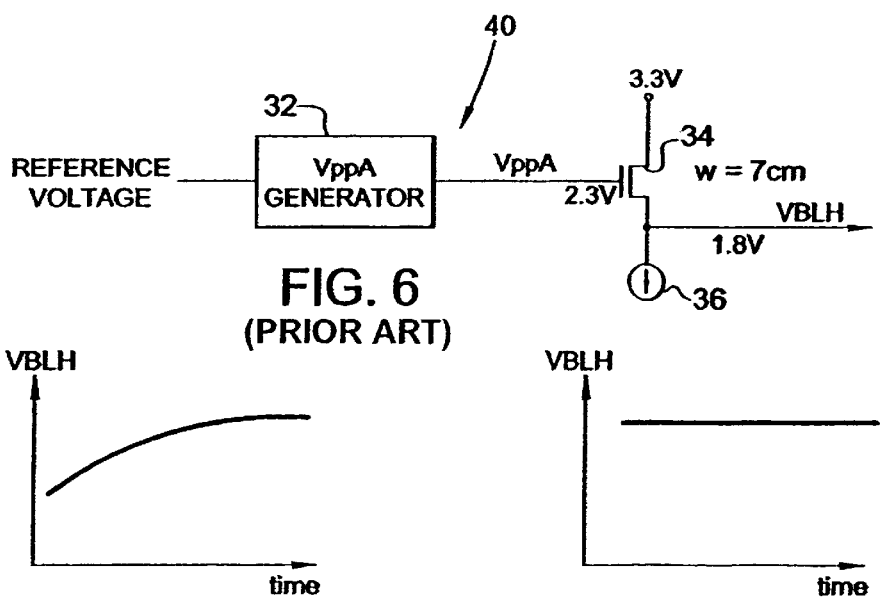
FIG. 6 shows the voltage generator of FIG. 4 modified to include a bleeder circuit.
Figure 7A:
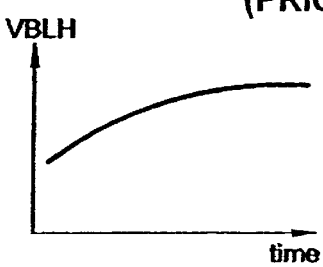
FIGS. 7(a) and 7(b) are graphs illustrating the relationship of the voltage VBLH and time for the voltage generators of FIGS. 4 and 6, respectively.
Figure 7B:
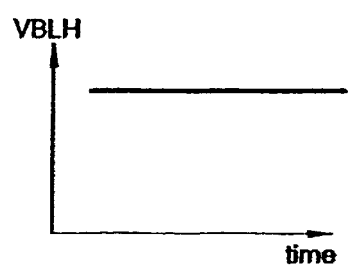
Figure 8:
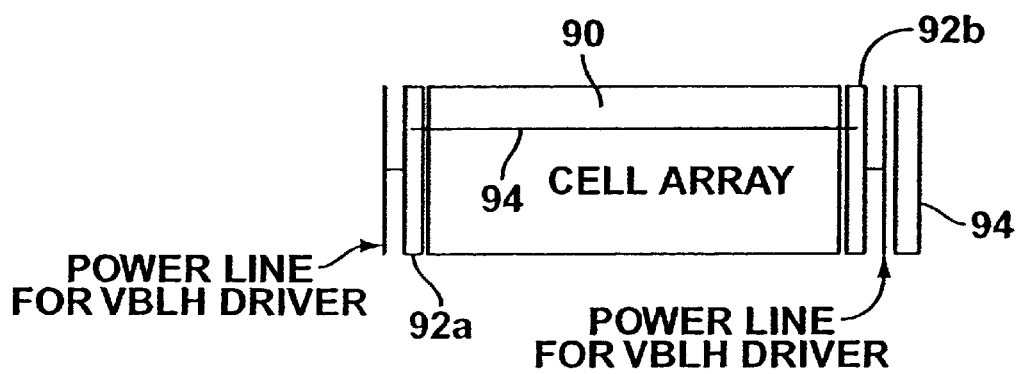
FIG. 8 shows a layout of a memory cell array and the components of a VBLH generator.
Figure 9:
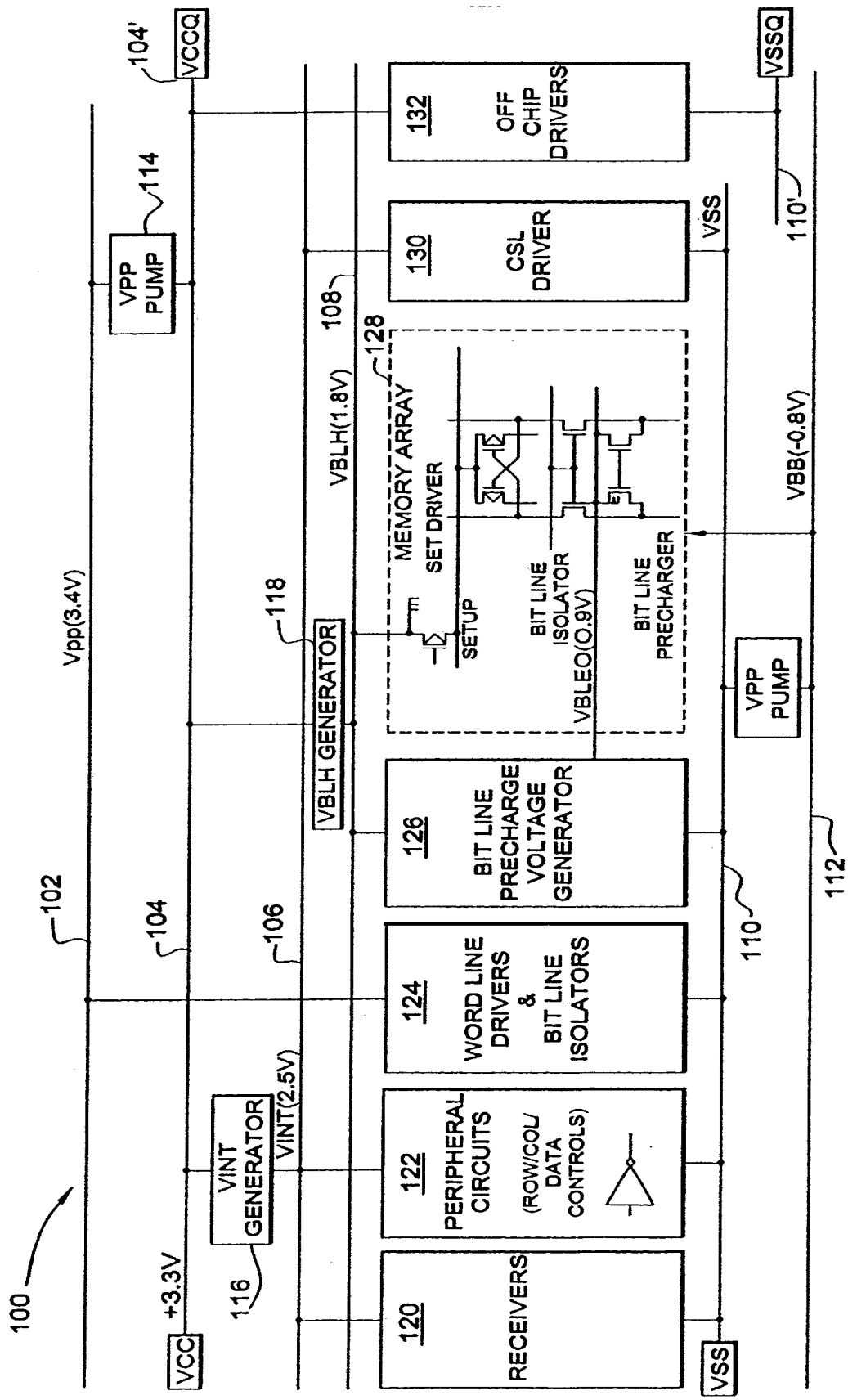
FIG. 9 is a schematic block diagram of a power supply system for a semiconductor memory device.

FIG. 9 is a schematic block diagram of a power system 100 for a semiconductor memory device in which the voltage generator of the present invention may be implemented. Power system 100 includes VPP power line 102, VCC power line 104, VINT power line 106, VBLH power line 108, VSS power line 110, and VBB power line 112. A VPP pump circuit 114 boosts the voltage VCC (e.g., about +3.3 volts) to about 3.4 volts. VPP at 3.4 volts is assured even when VCC may drop to 2.8 volts. A VINT generator 116 uses the voltage VCC to generate an internal voltage VINT of about 2.5 volts. A VBLH generator 118 uses the voltage VCC to generate a VBLH voltage of about 1.8 volts. A VBB pump circuit uses the voltage VSS to generate a VBB voltage of about –0.8 volts. The elements of the semiconductor memory device are appropriately connected to these various power lines. For example, receivers 120 and peripheral circuits 122 (such as row decoders, column decoders and the like) are connected between VINT power line 106 and VSS power line 110. Receivers 120 may include circuits used to detect input signal line changes, signals including, for example, /RAS, /CAS, /WE, CKE, CLK, ADDRESS, and other related signals. Word line drivers and bit line isolator circuits 124 are connected between VPP power line 102 and VSS power line 110. Bit line precharge voltage generator 126 is connected between VBLH power line 108 and VSS power line 110. Column select line driver circuit 130 (CSL driver) are connected between VINT power line 106 and VSS power line 110. Memory cell array 128 is connected between various voltage levels including VBLH power line 108 (through a secondary sense amp, not shown), VBB power line 112 (for the well bias voltage), VPP line 102 (connected to gates of transfer transistors), and VPL power line (not shown, connected to the capacitor cells, as the plate voltage). The SET driver of memory cell array 128 is connected at one end to VBLH power line 108 and at the other end to the SAP line. Off-chip driver circuits 132 are connected between VCCQ power line 104' and VSSQ power line 110'.

Memory cell array 128 includes memory cells (not shown in FIG. 9). The memory cells of memory cell array 128 are DRAM cells and more particularly are trench capacitor DRAM cells as described in the article by Nesbit et al. entitled "A 0.6 $\mu m^2$ 256 Mb Trench DRAM Cell With Self-Aligned BuriEd Strap (BEST)", IEDM Digest of Technical Papers, December 1993, pp. 627–620, the contents of which are incorporated in their entirety herein by reference. One advantage to using the disclosed invention in trench capacitor memories is that trench capacitor structures provide additional decoupling for the VBLH. The structure defined herein is also useful in stacked capacitor memory cell configurations. In the stacked memory cells, bit line capacitance may be larger than the trench capacitor memory cell and the load current of VBLH in stacked cell memory may become larger than that in trench cell memories. To supply these high peak currents, the system described herein is useful as well. Likewise, this invention is applicable to SRAMs, Non-Volatile memories, and FRAMs.

Figure 10:
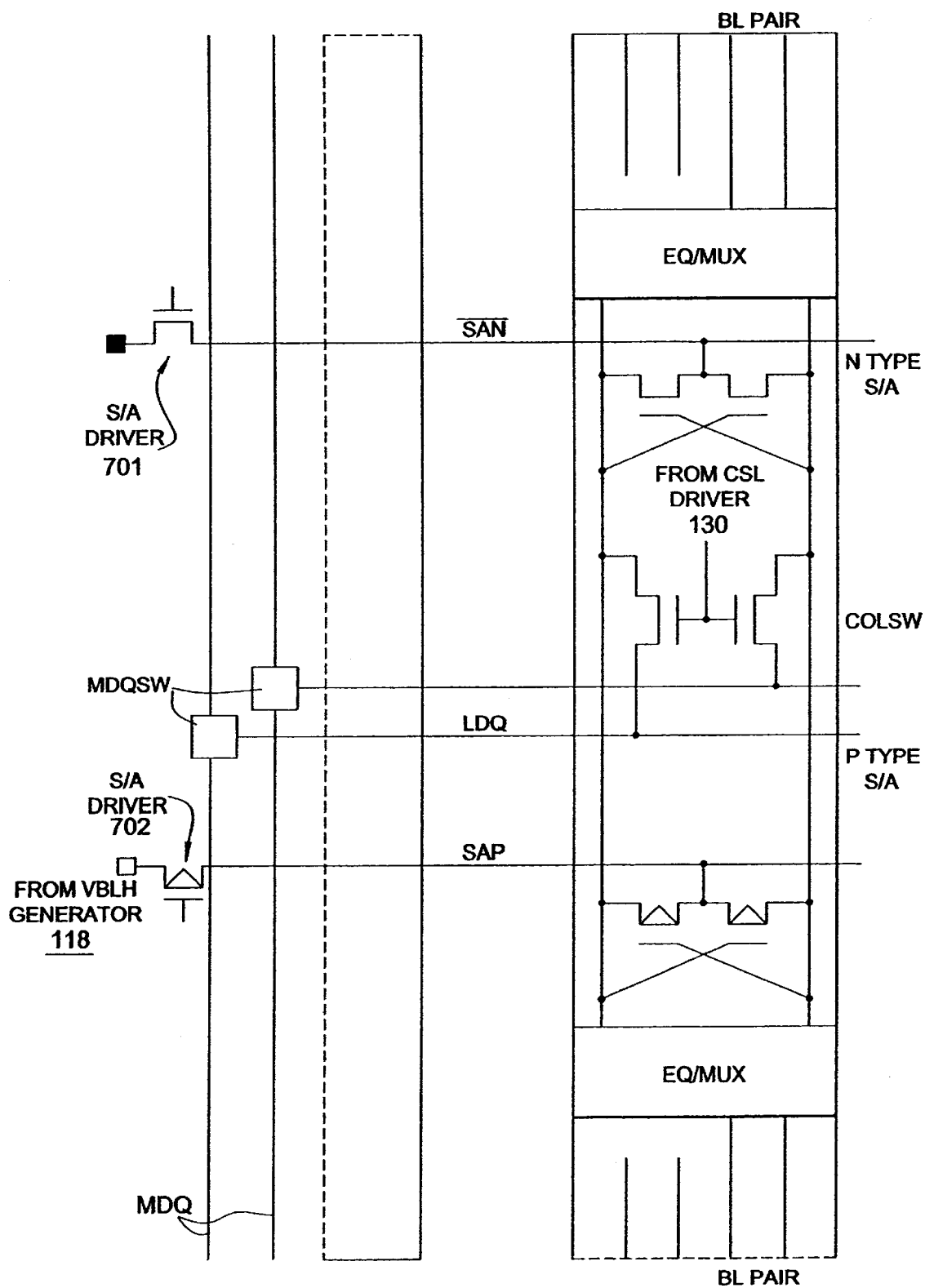
FIG. 10 is a circuit schematic of a two-sided shared sense amplifier.

FIG. 10 is a circuit schematic showing a portion of the memory cell array 128 and shows a two-sided shared sense amplifier. A master data bus switch MDQSW connects local data line LDQ to master data line MDQ. Local data line LDQ depicted in FIG. 10 is a single line having complementary signal carrying wires. Similarly, master data line MDQ is a single line having complementary signal carrying wires. Master data line switch MDQSW includes two switches, preferably MOS type transistor switches, connecting the respective complementary wires of local data line LDQ to the wires of master data line MDQ.

Figure 11:
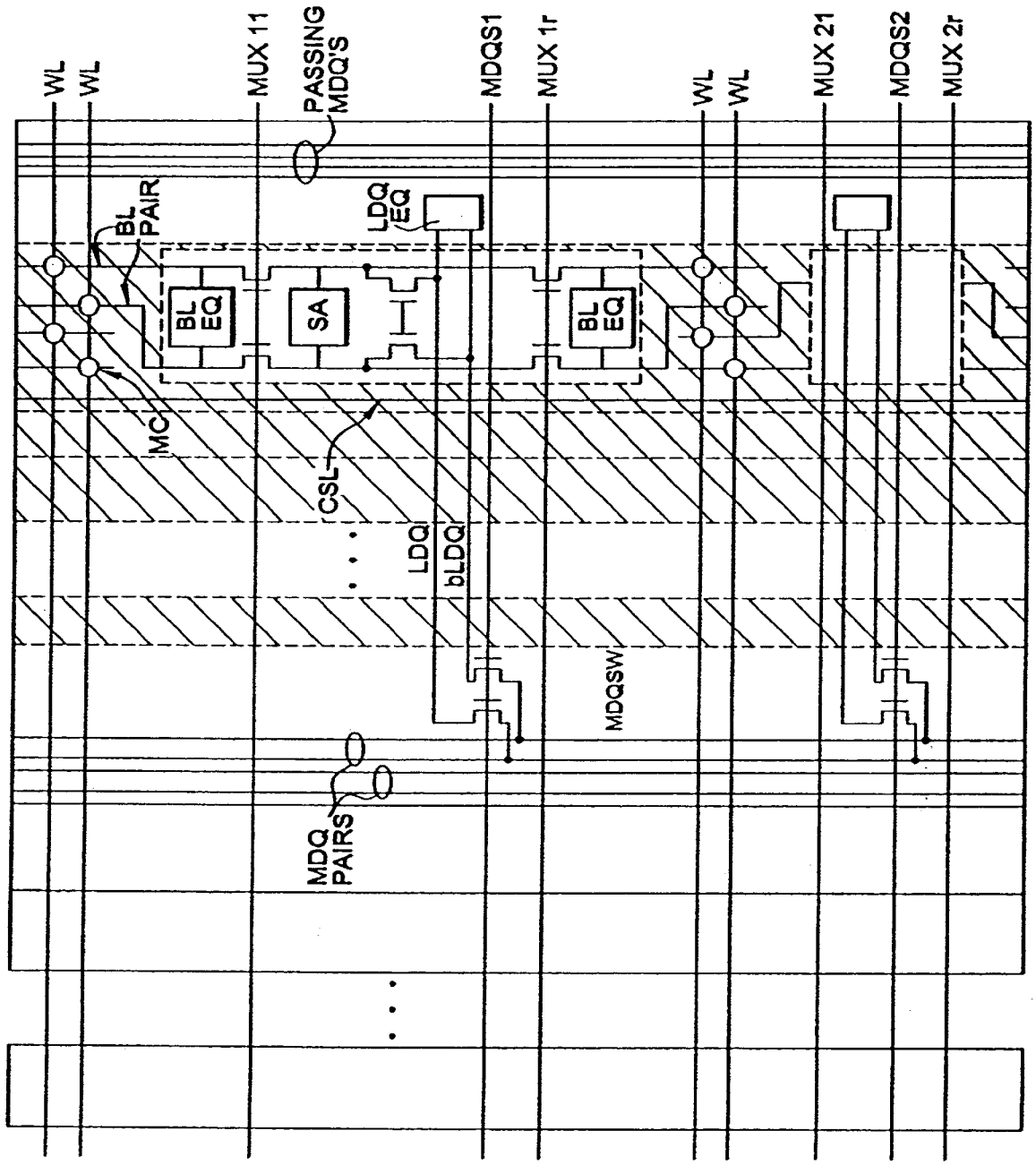
FIG. 11 is a more detailed circuit schematic of the components shown in FIG. 10.

The sense amplifier includes an N-type sense amplifier portion and a P-type sense amplifier portion. The N-type sense amplifier portion is controlled by a signal /SAN driven by a first S/A driver 701 and the P-type sense amplifier portion is controlled by a signal SAP driven by a second S/A driver 702. The output of VBLH generator 118 is supplied to second S/A driver 702. Together, the N- and P-type sense amplifier portions form a latching sense amplifier circuit. The signals latched in the sense amplifier may be transferred to local data line LDQ through column select switch COLSW. Column select switch COLSW is controlled by a column select signal CSL which is generated by CSL driver circuit 130. The latching sense amplifier is connected to bit line pairs through one of two equalizer/multiplexer (EQ/MUX) circuits, each disposed adjacent to the N-type sense amplifier portion and the P-type sense amplifier portion, respectively. The bit line isolator and bit line precharge circuits of FIG. 9 correspond to the multiplexer and equalizer circuits of FIG. 10, respectively. The multiplexer portion of this circuit may include a pair of switching transistors, each connected in series in each of the two complementary signal lines as shown in FIG. 11. In FIG. 11, a first multiplexer is controlled by signal MUXil and a second multiplexer is controlled by a signal MUXir and the bit line equalizer is shown functionally as a block shunting across the two complementary bit lines of a bit line pair. Conventionally, such a bit line equalizer may be a single shunting switch transistor or a pair of shunting transistors connected in series to shunt across the wires of the bit line pair. Of course, the present invention is not limited to any particular arrangement for a bit line equalizer.

In FIGS. 10 and 11, there are shown two pairs of bit lines connected to respective ones of the two equalizer/mutliplexers EQ/MUX. There is also shown two pairs of unconnected bit lines disposed adjacent to the bit line pairs which are connected to the equalizer/multiplexers. Thus, the sense amplifier circuit of FIGS. 10 and 11 is a two-sided sense amplifier circuit shared between adjacent cell arrays. Of course, while the invention is described as being used with a memory device having the two-sided sense amplifiers shown in FIGS. 10 and 11, the invention is not limited in this respect and may be used in memory devices having other types of two-sided sense amplifiers or in memory devices having single-sided sense amplifiers.

FIG. 11 shows the master bus switches MDQSW coupled to local data bus LDQ. As noted above, sense amplifier SA includes both the N-type and P-type sense amplifier portions and bit line equalizer circuit BL EQ may include a shunting transistor switch. MOS transistors controlled by signals MUXil and MUXir form the multiplexer that enables the sense amplifier to be shared between two cell arrays. Prior to the transfer of signals, the two complementary wires comprising the local data line are equalized with local data line equalizer LDQ EQ which is arranged in substantially the same manner as the bit line equalizer circuit BL EQ. Master data line switches MDQSW connect the local data lines to the master data lines. Additional details of the layout of a semiconductor memory device in which the present invention may be implemented may be found in U.S. Pat. No. 5,546,349 or U.S. application Ser. No. 09/061,058, the contents of which are incorporated herein by reference.

Figure 12:
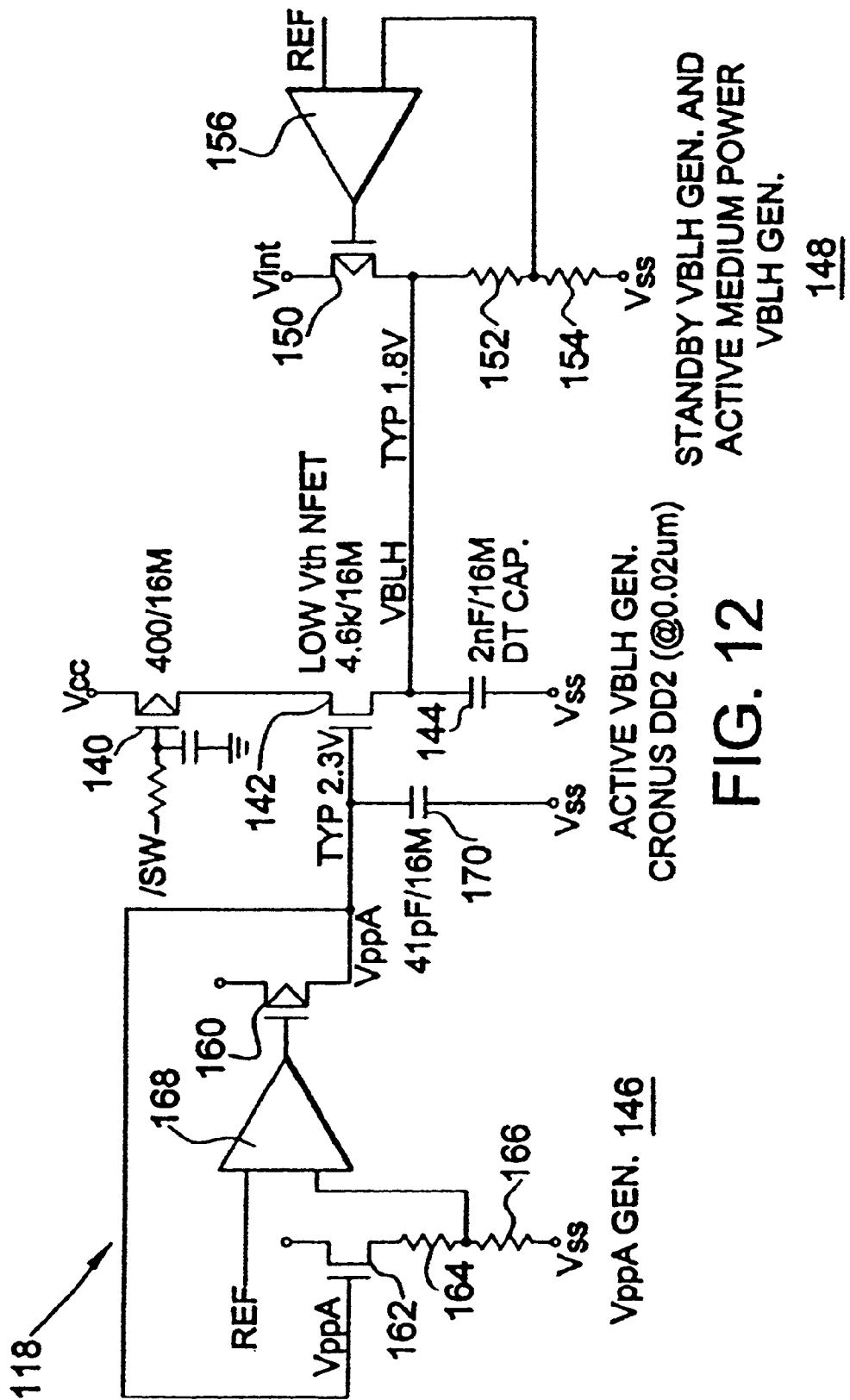
FIG. 12 is a schematic block diagram of the VBLH generator shown in FIG. 9.

FIG. 12 is a schematic block diagram of VBLH generator 118 shown in FIG. 9. VBLH generator 118 includes a P-channel MOS transistor 140, an N-channel MOS transistor 142, and a capacitor 144 connected in series between VCC and VSS. Capacitor 144 is advantageously provided as a deep trench capacitor as will be described in detail below. The gate of P-channel MOS transistor 140 is supplied with a switching signal /SW via a RC circuit and the gate of N-channel MOS transistor 142 is supplied with the output of a VppA generator 146. Alternatively, the switching signal /SW may be supplied by any other related source as is well known in the art. VppA generator 146 includes a P-channel MOS transistor 160 having a first end connected to voltage VCC and a second end connected to the gate of N-channel MOS transistor 142. An N-channel MOS transistor 162 has a first end connected to voltage VCC and a gate connected to the second end of P-channel MOS transistor 160. A resistive element 164 has a first end connected to a second end of N-channel MOS transistor 162 and a resistive element 166 has a first end connected to a second end of resistive element 164 and a second end connected to VSS. A comparator 168 has a first input terminal connected to a reference potential and a second input terminal connected to a node between resistive elements 164 and 166. An output of comparator 168 is connected to the gate of P-channel MOS transistor 160. A capacitor 170 is connected between the gate of N-channel MOS transistor 142 and VSS. While the capacitor 170 is considered to be part of the VBLH generator, it is placed near the NMOS driver 142 to stabilize the VppA node. The voltage VBLH is derived from a node between N-channel MOS transistor 142 and capacitor 144.

A feedback regulator 148 regulates the voltage VBLH and includes a P-channel MOS transistor 150, a resistive element 152, and a resistive element 154 connected in series between VINT and VSS. Feedback regulator 148 further includes a comparator 156 which is supplied at one input terminal with a reference voltage and at the other input terminal with a voltage derived from a node between resistive elements 152 and 154.

Figure 13A:
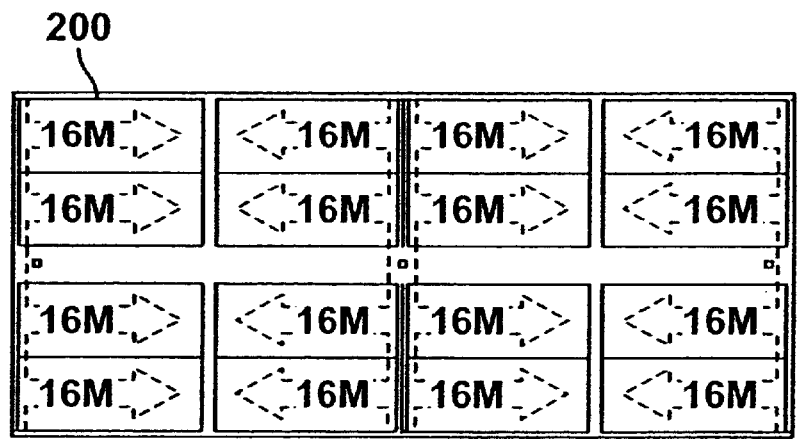
FIGS. 13(a) and 13(b) illustrate a layout of a 256 Mbit DRAM including a VBLH generator in accordance with the present invention.
Figure 13B:
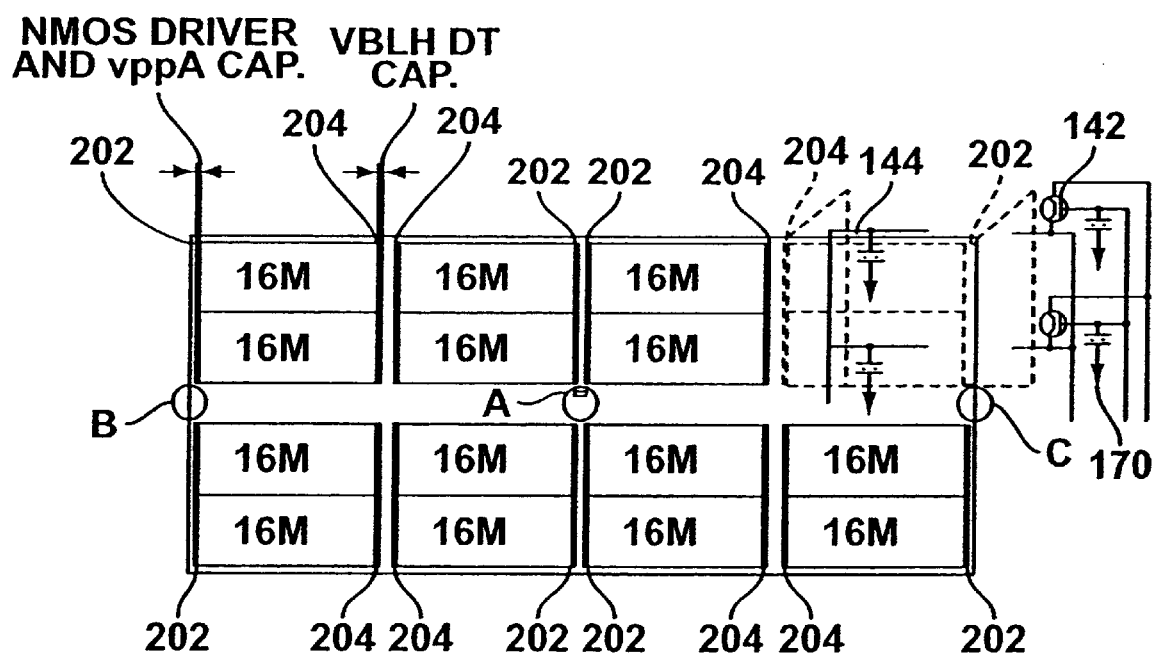

FIGS. 13(a) and 13(b) illustrate the layout of a 256 Mbit DRAM device including the VBLH generator of FIG. 12. As shown in FIG. 13(a), the 256 Mbit DRAM device includes sixteen 16 Mbit arrays 200. The arrows shown in each of the 16 Mbit arrays 200 point from the "outer sides" of the arrays to the "inner sides" of the arrays. As schematically shown in FIG. 13(b), the N-channel MOS driver transistor 142 and the capacitor 170 are arranged in regions 202 adjacent to the outer side of each 16 Mbit array 200 and the capacitors 144 are arranged as deep trench capacitors in regions 204 adjacent to the inner side of each 16 Mbit array 200. In one embodiment, the capacitor 170 is a planar capacitor. The width of the regions 202 in the case of a transistor 142 having a channel length of about 0.36 μm and a channel width of about 4600 μm is about 15 μm (per 16 Mbit array) and the width of the regions 204 in the case where about 60,000 deep trench capacitors are connected together to provide a capacitance of about 2 nF is about 19 micrometers (per 16 Mbit array). The remainder of the VppA generator may be located in the center of the chip of FIG. 13(b), in region A. The PMOS switches may be located at located at regions A, B, and C as shown in FIG. 13(b), with four switches located at region A, two switches at region B, and two switches at region C. The PMOS voltage regulator may also be located at region A. In one embodiment, only one VppA generator, one PMOS generator (stand-by) and one PMOS generator (active) power the memory cell array 200. With reference to FIG. 13(b), the NMOS driver and the VppA capacitor include parallel components. In one embodiment, each symbol shown in FIG. 13(b) represents the total number of elements per 16 Mbit array. As shown in FIG. 13(b), a single PMOS switch (w=800 μm) may be connected to two 16 Mbit units. In one embodiment, there is only one VppA generator per chip. All of the gate nodes of the NMOS driver are connected together. A single PMOS switch (w=800 μm) is connected to the NMOS driver in each 32 Mbit unit. In other words, a single PMOS switch is connected in two 16 Mbit units. So, for example, eight PMOS switches are used in a 256 Mbit chip. Further, only one VppA generator may be used as well as one PMOS active voltage regulator may be used and one PMOS stand-by voltage regulator may be used.

As noted above, capacitor 144 is formed as a plurality of deep trench capacitors. These deep trench capacitors are arranged with the same pitch and spacing between adjacent trench capacitors as the trench capacitors for the memory cells. However, the trench capacitors in the region 204 are preferably not isolated by isolation structures such as shallow trench isolation structures. This is one way to reduce the series resistance between the trench capacitance node and the VBLH node. Other ways exist and may be used as are known in the art.

Figure 14A:
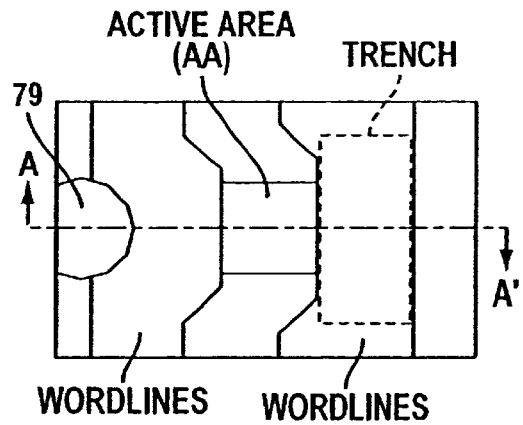
FIG. 14(a) is a top-down view of a trench DRAM cell usable in a semiconductor memory device incorporating the voltage generator of the present invention.
Figure 14B:
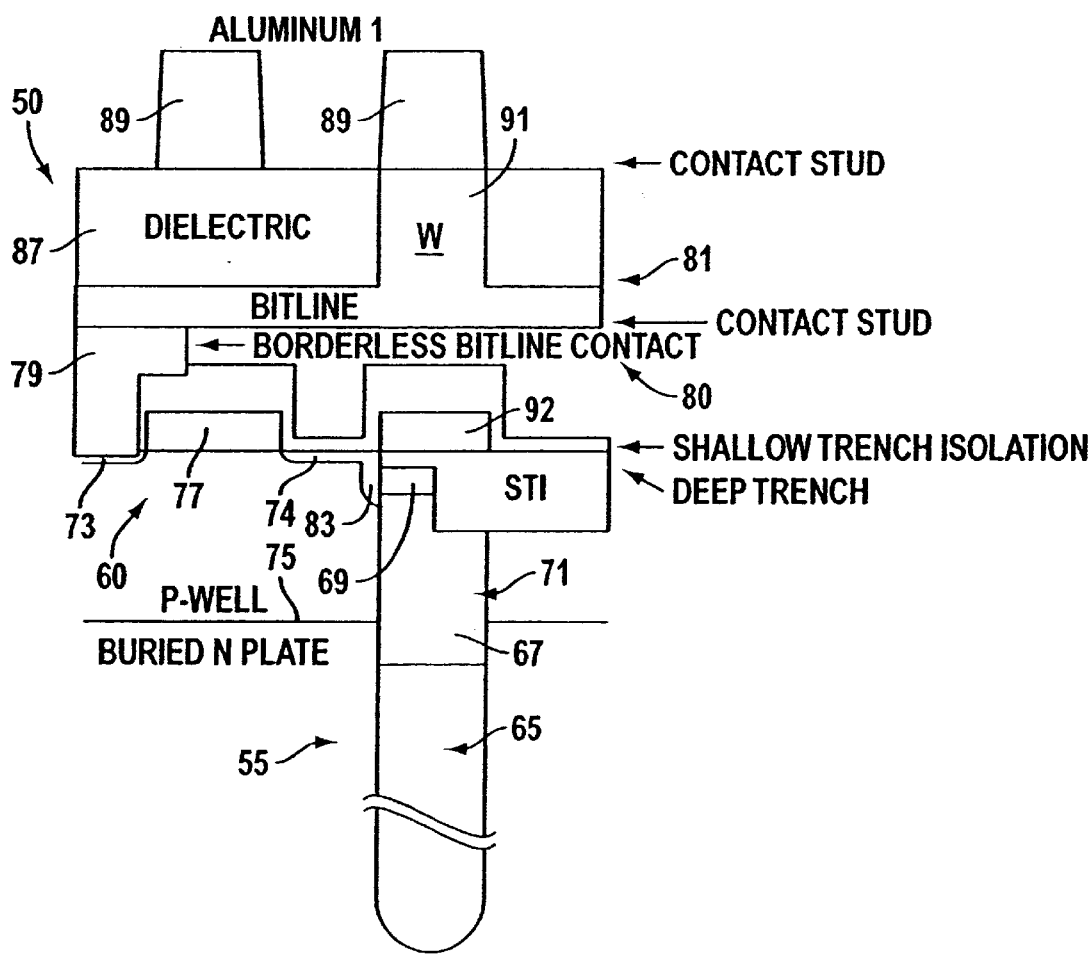
FIG. 14(b) is a cross-sectional view taken along line A–A' of FIG. 14(a).

FIGS. 14(a) and 14(b) illustrate a trench DRAM cell with a self-aligned buried strap usable in a semiconductor memory device incorporating the voltage generator of the present invention. Specifically, FIG. 14(a) is a top-down view of the trench DRAM cell and FIG. 14(b) is a cross-sectional view taken along line A–A' of FIG. 14(a). DRAM cell 250 includes a trench capacitor 255 and a transfer gate 260. Trench capacitor 255 includes a first N$^+$-type polycrystalline silicon fill 265, a second polycrystalline silicon fill 267, and a collar oxide 271. Transfer gate 260 includes N-type source/drain and drain/source regions 273 and 274 formed in P-type well 275 and a WSi$_x$/polycrystalline silicon gate 277 insulatively spaced from the channel region between source/drain region 273 and drain/source region 274. A bit line contact 279 formed in an opening in an insulating layer 280 (of BPSG, for example) electrically connects source/drain region 273 to bit line 281. A shallow trench isolation structure electrically isolates DRAM cell 250 from an adjacent DRAM cell and passing word line 292. Passing word line 292 has a WSi$_x$/polycrystalline silicon structure. A dielectric layer 287 is formed on bit line 81 and aluminum wirings 289 are formed on dielectric layer 287. One of the aluminum wirings 289 is connected to bit line 281 by a contact stud 291 of tungsten, for example. A diffusion region 283 electrically connects third polycrystalline silicon fill 269 and drain/source region 274 of MOS transfer gate 260. This diffusion region is formed by out diffusing dopants from the highly doped polycrystalline silicon fill in the storage trench into P-well 275. Diffusion region 283 and third polycrystalline silicon fill 269 constitute a buried strap for connecting trench capacitor 255 to transfer gate 260.

Figure 15A:
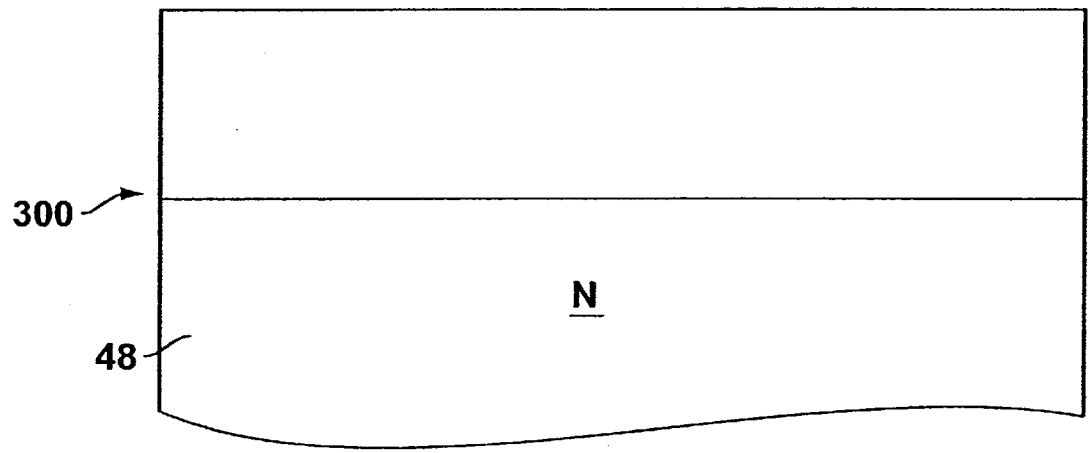
FIGS. 15(a)–15(g) illustrate a method of manufacturing the DRAM cell 250 of FIGS. 14(a) and 14(b).
Figure 15B:
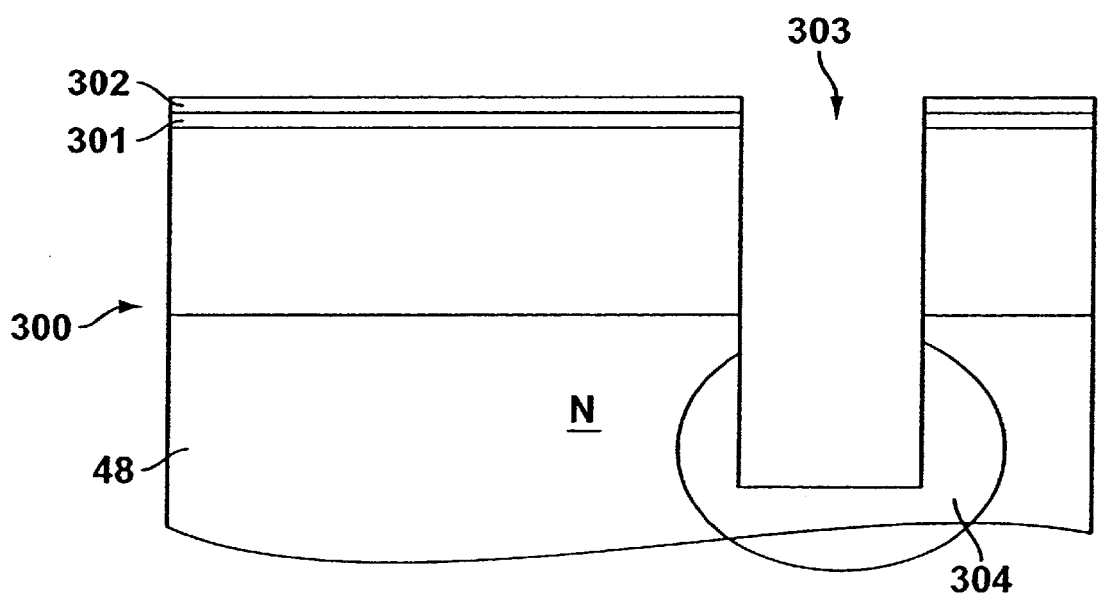
Figure 15C:
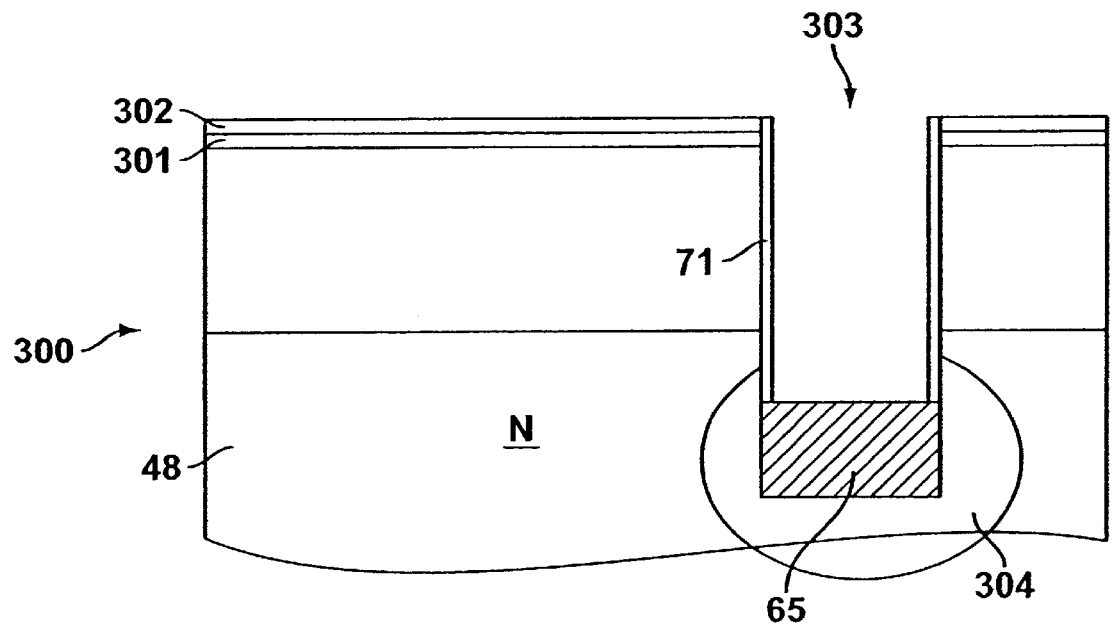

A method of manufacturing the DRAM cell 250 will be described below with reference to FIGS. 15(a)–15(g). As shown in FIG. 15(a), buried N-type well 248 is formed in a P-type semiconductor substrate 300 by implanting phosphorous below the intended P-well for a memory cell array. A buried N-type well may also be formed by other methods, e.g., P-well implantation into an N-type semiconductor substrate or by epitaxy. A silicon nitride layer 302 having a thickness of about 0.2 micrometers is formed by chemical vapor deposition, for example, on the surface of a thin oxide layer 301 having a thickness of about 10 nanometers that is thermally grown on semiconductor substrate 300. Oxide layer 301 and silicon nitride layer 302 are patterned and etched to provide a mask for etching a trench 303. Trench 303 is etched using an anisotropic etching process to a depth of about 8 micrometers as shown in FIG. 15 (b). After storage node trench 303 is etched, an N-type capacitor plate 304 is formed by outdiffusing arsenic from the lower portion of trench 303. This may be accomplished, for example, by depositing an arsenic doped glass layer, etching the arsenic doped glass layer to remain only at the lower portion of trench 303, and performing an annealing process to outdiffuse the arsenic. A storage node dielectric layer (not shown) such as an oxide-nitride (ON) layer or a nitride-oxide (NO) layer is then formed in trench 303. After the dielectric is formed, a first conductive region is formed by filling trench 303 with an impurity-doped first conductive material such as N$^+$-type polycrystalline silicon. The filling step may be carried out using chemical vapor deposition of silane or disilane, for example. The N$^+$-type polycrystalline silicon is then etched back to a first level within trench 303 using an isotropic etch process to form fist trench fill 265. The level of first trench fill 265 is, for example, about 1.0 micrometer below the surface of semiconductor substrate 300. Collar oxide 271 is then formed on the sidewall of the portion of trench 303 opened by the etching back of the N$^+$-type polycrystalline silicon using low pressure chemical vapor deposition (LPCVD) or plasma-enhanced chemical vapor deposition (PECVD) TEOS as shown in FIG. 15(c).

Figure 15D:
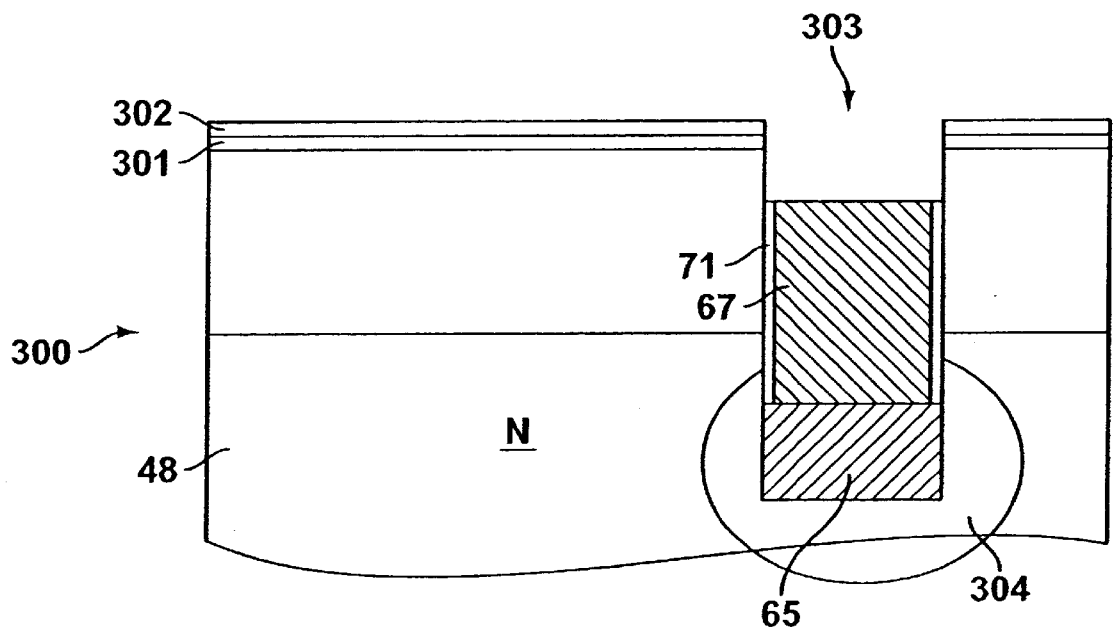

A second conductive region is formed by filling in the remainder of trench 303 with a second conductive material. The second conductive material may be, for example, N+-type polycrystalline silicon or undoped polycrystalline silicon and may be formed by chemical vapor deposition (CVD). The second conductive material and the oxide collar 271 are then etched back to a second level within trench 303 to form second trench fill 267 which is insulated from the semiconductor substrate by collar oxide 271 as shown in FIG. 15(d). The depth of the buried strap to be formed in a subsequent process step is defined by this controlled etchback of the second conductive material and collar oxide 271. Second trench fill 267 is etched back to about 0.1 micrometer below the surface of semiconductor substrate 300. An in-situ removal of a native oxide in trench 303 is then performed. In particular, the native oxide on the upper surface of second trench fill 267 and on the sidewall of trench 303 through which impurities for the buried strap will subsequently be outdiffused are removed. This removal of native oxide may be carried out by an in-situ prebake in a hydrogen ambient at a temperature greater than 850° C., for example.

Figure 15E:
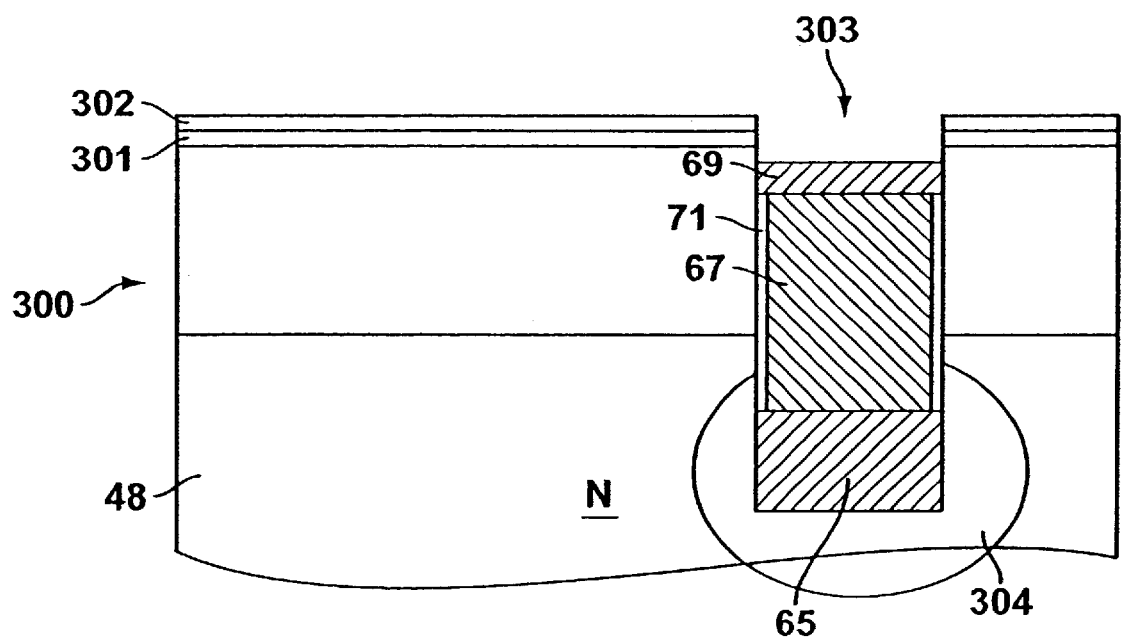

The portion of trench 303 opened by the etching back of collar oxide 271 and the second conductive material is then filled by a third conductive material. The third conductive material may be, for example, undoped polycrystalline silicon deposited by chemical vapor deposition (CVD). The polycrystalline silicon is then etched back using reactive ion etching, for example, to form a third trench fill 269 as shown in FIG. 15(e). The polycrystalline silicon is preferably etched back to about 0.05 micrometer below the surface of semiconductor substrate 300 as determined by the tolerable resistance of the buried strap, and by the recess etch controllability.

Figure 15F:
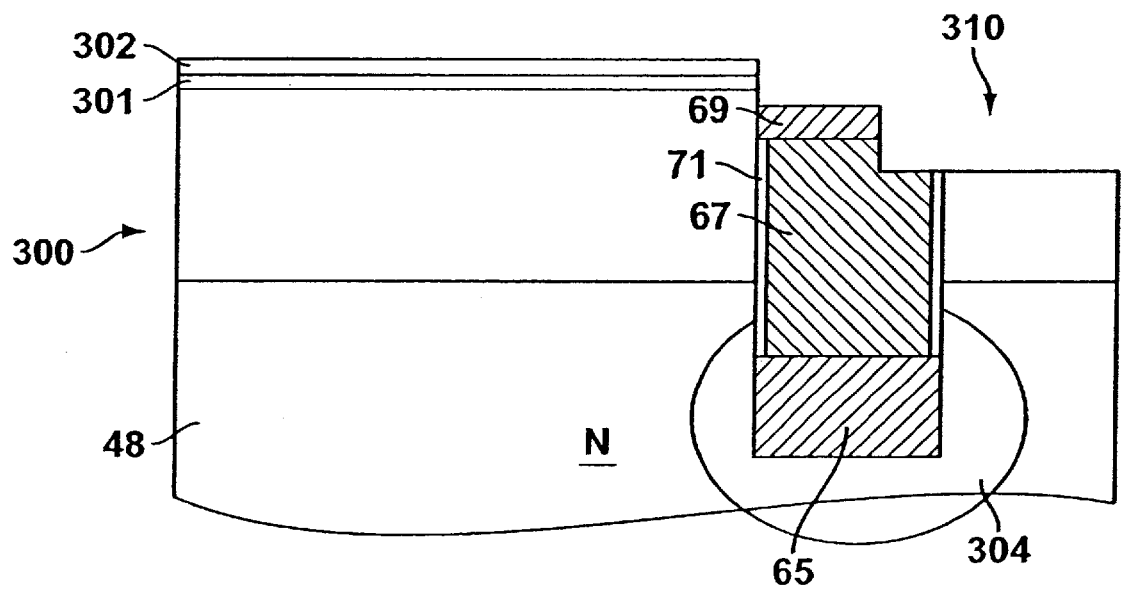
Figure 15G:
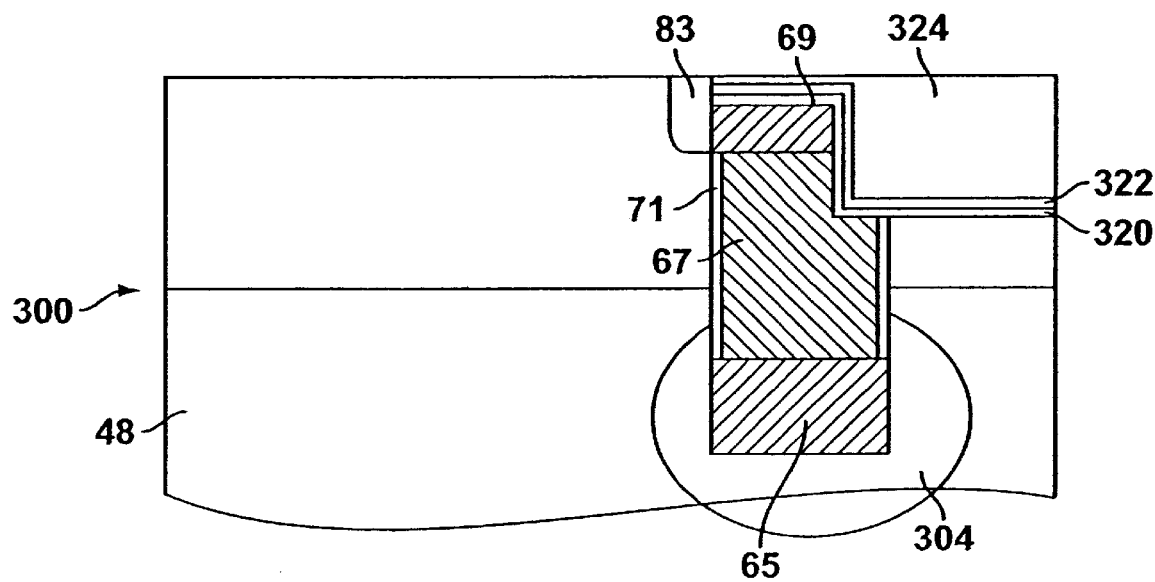

With reference to FIG. 15(f), a shallow trench 310 is formed to provide for shallow trench isolation. The trench sidewall is then oxidized to form an oxide layer 320 having a thickness of about 100 Å and a silicon nitride layer 322 having a thickness of about 50 Å is then deposited. The oxide and nitride linings serve to isolate collar oxide 271 from oxidant, and thereby suppress dislocation and stress. The trench is then filled with an insulator 324 such as silicon dioxide and the trench fill is then planarized using chemical mechanical polishing (CMP) and/or reactive ion etching (RIE). The pad silicon nitride layer is then stripped by chemical dry etching (CDE) or hot phosphoric acid and the pad oxide is then removed using a wet etch for removing, for example, 200 Å of silicon dioxide. At this time, the silicon dioxide in the trench is also etched. A sacrificial silicon dioxide layer having a thickness of about 100 Å is then formed on the surface of the substrate 300 and impurities may be implanted in what will be the channel regions of the transfer gates in order to control the threshold voltages thereof. The sacrificial oxide is then removed by etching away 120 Å of silicon dioxide.

A gate insulator may then be formed on the planar surface, and gate material may be deposited and patterned to form gate electrodes. Using the gate electrodes as masks, source/drain regions may be formed by ion implantation. Accordingly, transfer gates coupled to trench capacitors are realized. Interconnection between devices and metalization to the output terminals are conducted using techniques known in the art. During the complete DRAM fabrication process, impurities from the conductive regions within the trench are outdiffused to form strap portion 283.

In short, after forming trenches in a substrate, the steps for forming the deep trench capacitors may include: the deposition of a node dielectric by low pressure chemical vapor deposition (LPCVD) of silicon nitride; the reoxidation of the node dielectric; the deposition of a first polysilicon fill using POCVD; the chemical mechanical polishing (CMP) of the first polysilicon fill; the etching of a fist recess in the first polysilicon fill using RIE; the removal of the node dielectric film at the upper portion of the trench; the deposition of a collar oxide; the etching of the collar oxide using RIE; the deposition of a second polysilicon fill using LPCVD; the CMP of the second polysilicon fill; and the forming of a strap for connecting the deep trench capacitor to the transfer gate of the memory cell. This strap may be formed, for example, by recessing the second polysilicon fill and the collar oxide using RIE; the deposition of a third polysilicon fill by LPCVD; the CMP of the third polysilicon fill; and the recessing of the third polysilicon fill by RIE to a level which is about 50 nanometers below the surface of the semiconductor substrate 100. Generally, one or more of the polysilicon fills contains impurities which are outdiffused to the semiconductor substrate during the manufacturing process via the third polysilicon fill to form a connection to an impurity region of the transfer gate. In one aspect, from a manufacturing process view, the VBLH trench capacitor may be the same manufacturing process as that of a normal memory cell capacitor except for the STI (shallow trench isolation) region.

Figure 16:
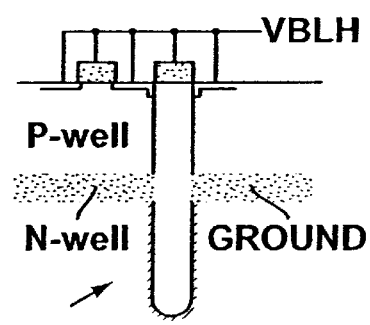
FIG. 16 is a cross-sectional view illustrating a deep trench capacitor formed in region 204 of FIG. 13(b).

FIG. 16 illustrates a trench capacitor formed in region 204. As shown in FIG. 16, no isolation structures isolate the trench capacitor of FIG. 16 from other trench capacitors. In addition, the transfer gates and the source/drain regions are all connected to VBLH. By connecting all of these nodes to the same voltages, adverse effects of manufacturing defects which may occur due to process variation, for example, may be minimized. In order to provide a capacitance of 100 pF, about 2900 trench capacitors are formed in region 204. In order to provide a capacitance of about 500 pF, about 14,000 trench capacitors are formed in region 204. In order to provide capacitance of about 2 nF, about 57,000 trench capacitors are formed in region 204. As noted above, in the case of trench capacitors for providing a capacitance of 2 nF, the width of region 204 is about 15 $\mu$m.

The use of trench capacitors for capacitor 144 is advantageous as compared, for example, with the use of planar capacitors because trench capacitors can provide a high capacitance while using a relatively small amount of area. Thus, the use of trench capacitors is consistent with the goal of providing highly integrated semiconductor memory devices. In addition, the structure of trench capacitors used for capacitor 144 is almost the same as the capacitor of a memory cell. Thus, the trench capacitors for capacitor 144 can be formed without significantly impacting the semiconductor memory device manufacturing process. Still further, the deep trench capacitors for capacitor 144 are formed on a side of the memory cell array opposite to the N-channel driver MOS transistor 142 components of the VBLH voltage generator. The capacitors can thereby function as a passive current supply and current is supplied to the VBLH power line from both ends, serving to reduce bounce in the VBLH signal and thereby enhance the stability of the VBLH signal. In addition, since the N-channel driver MOS transistor is located on only one side of the array, a power line for the VBLH generator need only be provided on one side of the array, thereby simplifying wiring.

Figure 17A:
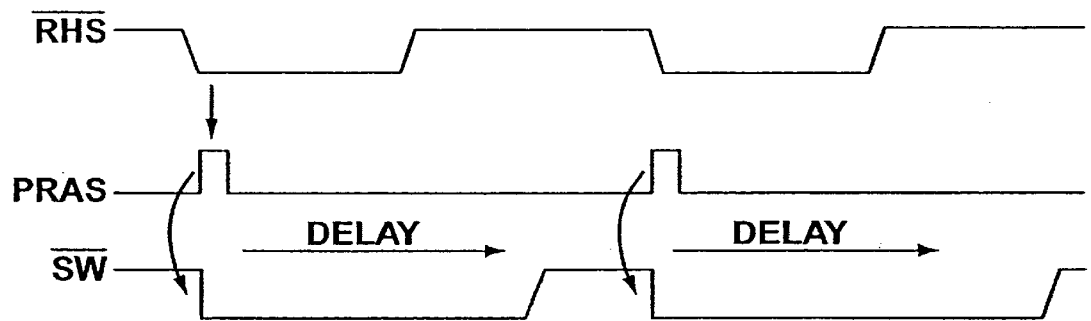
FIGS. 17(a)–17(d) are timing diagrams for the operation of the VBLH generator of FIG. 12.
Figure 17B:
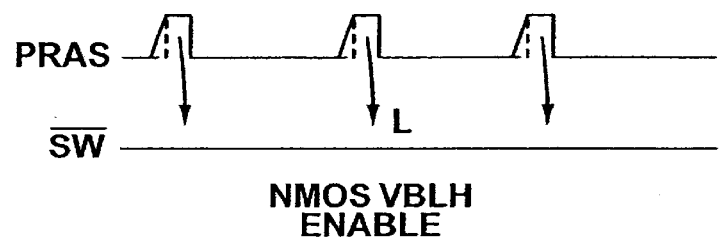
Figure 17C:
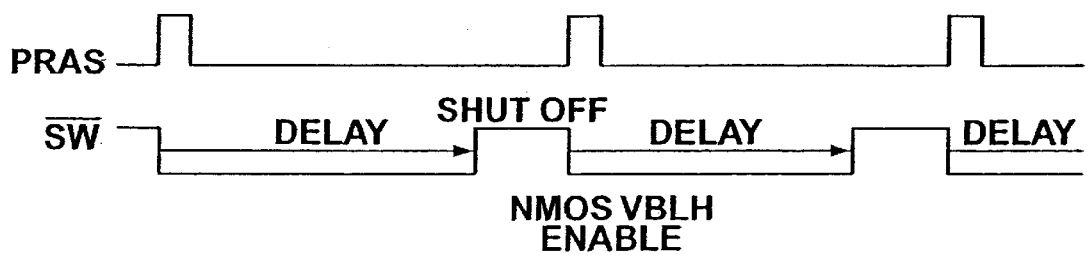

FIGS. 17(a)–17(c) are timing diagrams illustrating the relationship of the switching signal /SW supplied to P-channel MOS transistor 140 to the /RAS clock signal for clocking in a row address supplied to a row address decoder in order to select the word lines connected to the memory cells. With reference to FIG. 14(a), when the /RAS clock signal transitions to low level (low level=active level), a PRAS signal is generated. PRAS is generated in response to activation of the IRAS signal. The PRAS signal causes the switch signal /SW to transition to a low level, thereby turning ON P-channel MOS transistor switch 140. The PRAS signal is a type of pulse signal, whose rising edge corresponds to the falling edge of the /RAS signal and whose pulse width may be generated internally. The falling edge of the /SW signal corresponds to the rising edge of the PRAS. The rising edge of the /SW signal may be generated by an internal delay timer. P-channel MOS transistor 140 remains ON as long as the switch signal /SW is at low level. The time period that the switch signal /SW remains at low level may be determined by a simple timer or counter circuit which is activated by the PRAS signal. The counter may be controller circuit related to the VBLH generator and may be located inside the VBLH generator 118 of FIG. 9. At the end of the time period determined by the timer or counter circuit, the switch signal /SW returns to high level and P-channel MOS transistor 140 is turned OFF.

Figure 17D:
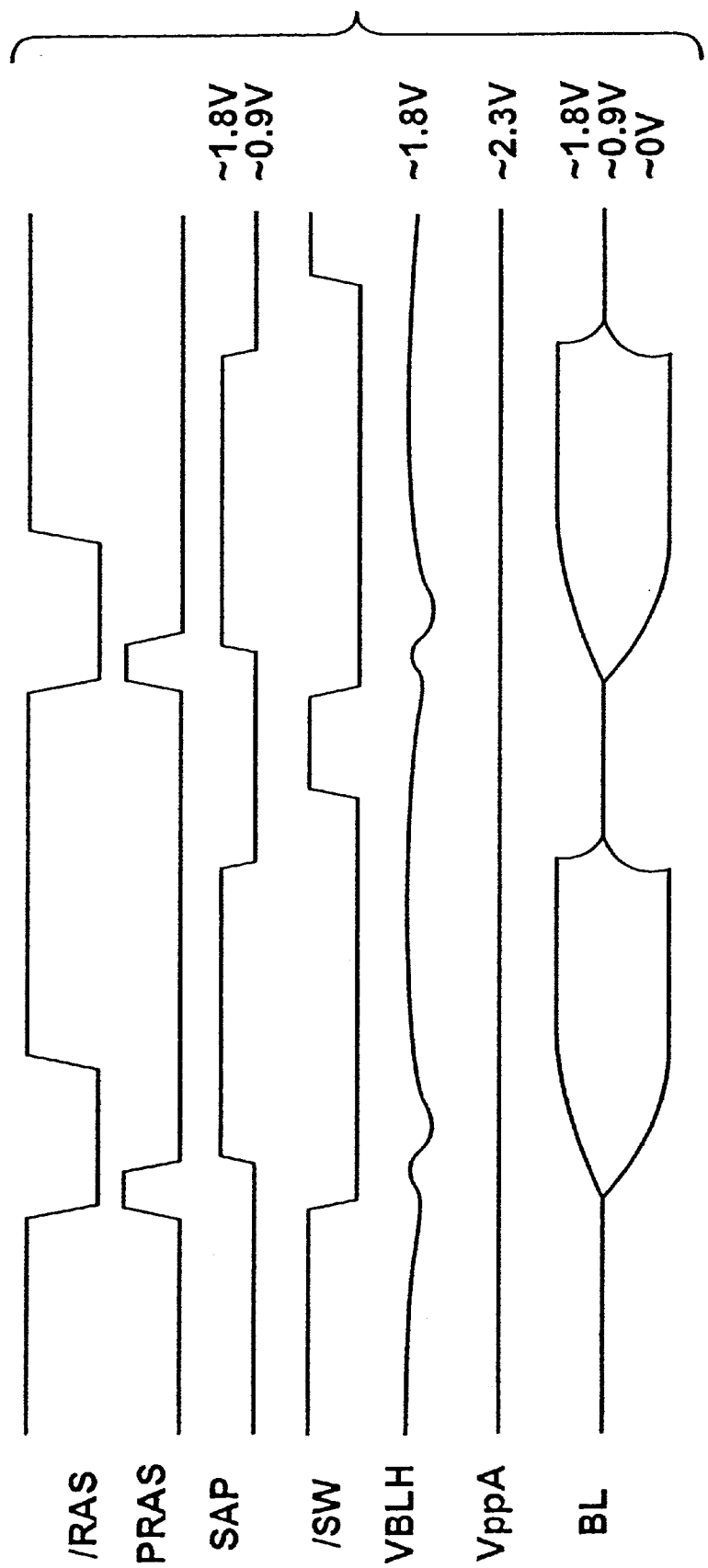

FIG. 17(d) shows a timing diagram which also shows signal SAP and the relationship of /RAS, PRAS, /SW, VBLH, VppA, and the bit line potentials with a common time reference.

FIG. 17(b) illustrates a short cycle case in which the time period between consecutive occurrences of a PRAS pulse is less than the time period determined by the above-described counter or timer circuit. In this case, the switch signal /SW remains at low level and P-channel MOS transistor 140 remains ON. FIG. 17(c) illustrates a relaxed case in which the time period between consecutive occurrences of a PRAS pulse is greater than the time period between PRAS pulses shown in FIG. 17(a). The cycle is the period between a RAS active and the next RAS active. In the case of the auto precharge condition, the cycle corresponds to the RAS active cycle period. In the case of burst operation conditions, the cycle corresponds to the RAS to RAS bank active cycle periods.

Thus, the relatively large N-channel MOS transistor 142 is enabled during a limited time and supplies most of the current IBLH. At other times, for example, during stand-by, pre-charge, or low frequency operation conditions, the feedback regulator 148 maintains the VBLH level. In one illustrative implementation, the VBLH voltage and the power source of the VBLH generator are 1.8 volts and 3.3 volts respectively. Thus, the voltage drop of the P-channel MOS transistor 140 and the wiring resistance does not affect VBLH characteristics.

Here, the P-channel MOS transistor and wiring resistance cause a voltage drop. This voltage drop affects the drain node voltage of the VBLH NMOS driver. Therefore, if the voltage of the power source for the VBLH generator is close to the voltage VBLH, the voltage drop affects the VBLH voltage. However, if the power source voltage is sufficiently larger than VBLH, then it does affect the VBLH. The wiring resistance is related in part to the circuit arrangement. Because the VBLH NMOS drivers are placed near the cell array, the drain nodes of the VBLH NMOS driver are far from a connection pad. Accordingly, the resistance between the pad and the power source of the VBLH NMOS driver becomes relatively large. If the disclosed scheme is sensitive to the resultant voltage drop, it may be harmed by the drop caused by the wiring resistance.

The P-channel MOS transistor 140 is turned on before the current peak caused by sense amplifier operation and is turned off after the current peak. As noted above, this switching may be implemented using a simple counter or timer circuit. P-channel MOS transistor 140 and the wiring resistance between the external voltage node and the array voltage node suppress the current peak. Here, the P-channel MOS transistor resistance and the wiring resistance may be viewed as side effects in the present system. However, the arrangement and use of these side effects is used, in part, to reduce internal noise. If the resistance of the P-channel MOS transistor are zero, the turn on of the NMOS driver causes a significant di/dt noise problem. This noise problem is one of the detriments of a conventional NMOS VBLH arrangement. Therefore, here, at least in aspect, the present system eliminates the noise problem of conventional NMOS VBLH systems through the use of the above-identified "side effects".

The feedback regulator 148 also operates as a bleeder circuit, but current consumption is independent of sub-threshold leakage of the NMOS driver. The feedback regulator 148 includes a resistor, which is connected between VBLH and VSS. This resister has a current path, so it functions as a current bleeder. However, in this case, this current bleeding may be referred to as a side effect. If the PMOS switch is not implemented, voltage creep may be harder to prevent. Most of the current IBLH is supplied by the N-channel MOS transistor 142. Thus, a large current capability of the feedback regulator 148 is not needed and a high response is not needed. The scheme described herein is also useful with other voltages, including VINT. For example, a high-speed device needs a high current generator. In this regard, the VINT current requirement is similar to the VBLH requirement and can be met in a similar fashion.

EXAMPLE 1

Figure 18A:
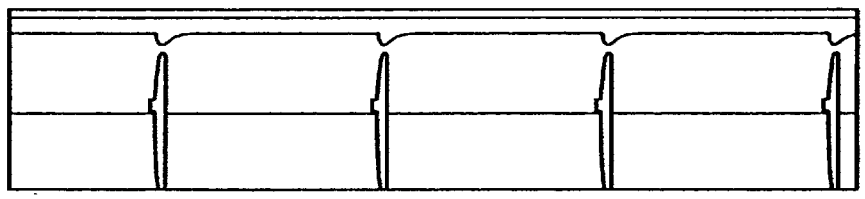
FIGS. 18(a)–18(c) are graphs of simulation results.
Figure 18B:
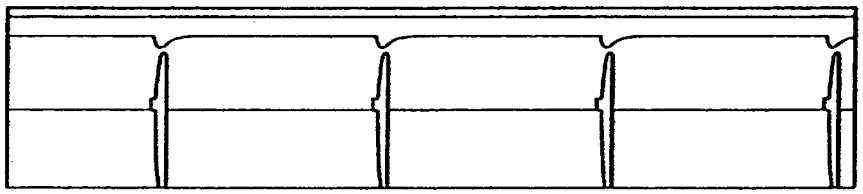
Figure 18C:
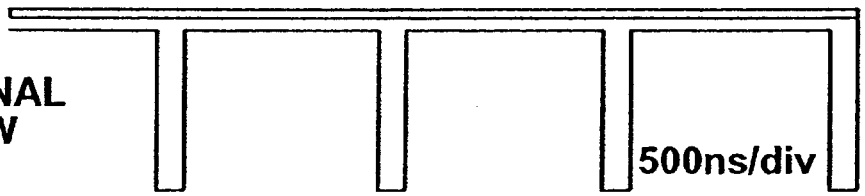

FIGS. 18(a)–18(c) illustrate simulation results which demonstrate the advantages of the present invention. The following table lists various parameters used in the simulation using HSPICE simulation software:

| Parameter | Value |
|---|---|
| Total channel width of the NMOS Driver | 64000 um |
| Channel length of the NMOS Driver | 0.36 um |
| Total Capacitance for VBLH | 32 nF |
| Total Capacitance for VppA | 0.6 nF |
| Total Channel Width of the PMOS Switch | 3200 um |
| Channel Length of the PMOS Switch | 0.36 um |
| Vext | 2.8 V |
| Vint | 2.4 V |

FIG. 18(a) shows the levels of VBLH and bit lines BL and /BL (see FIG. 9) when the voltage generator of FIG. 12 does not include P-channel MOS transistor 140; FIG. 18(b) shows the levels of VBLH and bit lines BL and /BL when the voltage generator of FIG. 12 is used; and FIG. 18(c) illustrates the timing of the switching signal /SW supplied to P-channel MOS transistor 140. As can be seen in FIG. 18(a), in the stand-by state, the voltage VBLH is affected by voltage creep; that is, the voltage VBLH slowly increases. With reference to FIG. 18(b), it can be seen that when P-channel MOS transistor 140 is provided and this P-channel MOS transistor is switched OFF during the stand-by state, the voltage VBLH is substantially constant and voltage creep is significantly reduced.

The VBLH voltage generator described above makes the voltage rise due to sub-threshold leakage very small. Thus, voltage creep is significantly reduced and a stable VBLH voltage may be provided. In addition, the waste current becomes smaller (e.g., 5 microamps in standby and 350 microamps in active) than in a conventional bleeder scheme. In addition, an NMOS transistor having a low threshold voltage may be used for the NMOS driver; thus, a non-boosted voltage may be supplied to the gate of the NMOS driver.

EXAMPLE 2

Figure 19A:
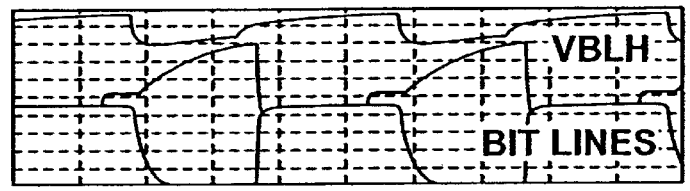
FIGS. 19(a)–19(c) illustrate simulation results for varying capacitance values of capacitor 144.
Figure 19B:
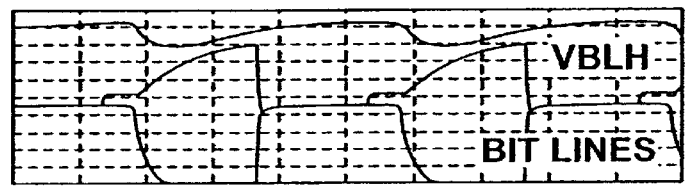
Figure 19C:
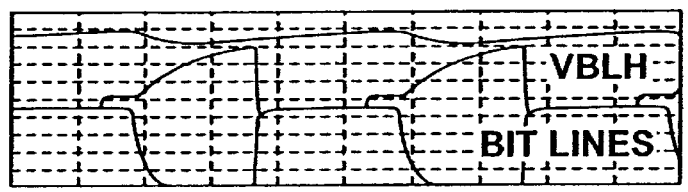

FIGS. 19(a)–19(c) illustrate simulation results for varying capacitance values of capacitor 144. The same simulation conditions for FIGS. 18(a)–18(c) was used for FIGS. 19(a)–19(c). Specifically, FIG. 19(a) illustrates simulation results when capacitance 144 has a capacitance of 100 pF; FIG. 19(b) illustrates simulation results when capacitor 144 has a capacitance of 500 pF; and FIG. 19(c) illustrate simulation results when capacitor 144 has a capacitance of 2 nF. It can be seen from the simulation results that increasing the capacitance of capacitor 144 serves to reduce fluctuations in VBLH during sense amplifier operations. The simulation as shown in FIGS. 19(a)–19(c) includes the PMOS switch as described above. Here, in this simulation, the PMOS switch is always on so the simulation exhibits voltage creep.

While particular embodiments of the present invention have been described and illustrated, it should be understood that the invention is not limited thereto since modifications may be made by persons skilled in the art. The present application contemplates any and all modifications that fall within the spirit and scope of the underlying invention discloses and claimed herein.

We claim:

1. A voltage generator for outputting an output voltage at an output terminal thereof, comprising:
    a driver MOS transistor of a first conductivity type having a fast end connected to said output terminal:
    a first MOS transistor of second conductivity type connected between a first voltage node and a second end of said driver MOS transistor;
    a capacitor connected between said output terminal and a second voltage node, wherein said capacitor comprises a plurality of trench capacitors formed in a semiconductor substrate; and
    a first voltage generator connected to said output terminal, for generating a first voltage supplying to said output terminal.

2. The voltage generator according to claim 1, further comprising:
    a voltage regulator connected to said output terminal.

3. The voltage generator according to claim 1, further comprising:
    a voltage generating circuit for generating a voltage which is supplied to a gate of said driver MOS transistor.

4. The voltage generator according to claim 1, wherein said switch element comprises a MOS transistor of a second conductivity type.

5. The voltage generator according to claim 1, wherein the driver MOS transistor is arranged in a first region and the capacitor is arranged in a second region, the first region being located on one side of a memory cell array, the second region being located on another side of the memory cell array, which is opposite to said one side thereof.

6. The voltage generator according to claim 1, wherein the driver MOS transistor is arranged in a first region and the capacitor is arranged in a second region, the first region being located on one side of each of memory cell arrays included in a chip, the second region being located on another side of each of memory cell arrays, which is opposite to said one side thereof.

7. A voltage generator for outputting a voltage at an output terminal thereof, comprising:
    a driver MOS transistor of a first conductivity type having a first end connected to said output terminal;
    a first MOS transistor of second conductivity type connected between a first voltage node and a second end of said driver MOS transistor,
    a capacitor connected between said output terminal and a second voltage node, said capacitor comprising a trench capacitor formed in a semiconductor substrate; and
    a first voltage generator connected to said output terminal, for generating a first voltage supplying to said output terminal.

8. The voltage generator according to clam 1, where said first voltage generator has a P channel MOS transistor, a first end of the P channel MOS transistor is connected to said output terminal.

9. The voltage generator according to claim 1, further comprising:
    a second voltage generator connected to a gate electrode of the driver MOS transistor, for generating a second voltage supplying to said gate electrode of the driver MOS transistor.

10. The voltage generator according to claim 1, wherein said fist MOS transistor is the P channel MOS transistor.

11. The voltage generator according to claim 7, wherein said first voltage generator has a P channel MOS transistor, a first end of the P channel MOS transistor is connected to said output terminal.

12. The voltage generator according to claim 7, further comprising:
    a second voltage generator connected to a gate electrode of the driver MOS transistor, for generating a second voltage supplying to said gate electrode of the driver MOS transistor.

13. The voltage generator according to claim 7, wherein said first MOS transistor is the P channel MOS transistor.

* * * * *

UNITED STATES PATENT AND TRADEMARK OFFICE
CERTIFICATE OF CORRECTION

PATENT NO.    : 6,477,079 B2
DATED         : November 5, 2002
INVENTOR(S)   : Tetsuya Kaneko et al.

It is certified that error appears in the above-identified patent and that said Letters Patent is hereby corrected as shown below:

<u>Column 14,</u>
Line 42, "fist" has been replaced with -- first --.

Signed and Sealed this

Sixth Day of May, 2003

JAMES E. ROGAN
*Director of the United States Patent and Trademark Office*